United States Patent [19]

Cline et al.

[11] 4,011,582
[45] Mar. 8, 1977

[54] DEEP POWER DIODE

[75] Inventors: Harvey E. Cline; Thomas R. Anthony, both of Schenectady, N.Y.

[73] Assignee: General Electric Company, Schenectady, N.Y.

[22] Filed: May 11, 1976

[21] Appl. No.: 685,284

Related U.S. Application Data

[63] Continuation-in-part of Ser. No. 411,011, Oct. 30, 1973, abandoned.

[52] U.S. Cl. .................. 357/60; 357/61; 357/88; 357/89; 357/90
[51] Int. Cl.$^2$ ............ H01L 29/04; H01L 29/161
[58] Field of Search ............ 357/60, 61, 88, 89, 357/90

[56] References Cited

UNITED STATES PATENTS 2,813,048    11/1957    Pfann ........................ 357/60

*Primary Examiner*—Edward J. Wojciechowicz
*Attorney, Agent, or Firm*—Donald M. Winegar; Joseph T. Cohen; Jerome C. Squillaro

[57] ABSTRACT

One region of a large area semiconductor power diode comprises recrystallized semiconductor material formed in situ, and joined to a second region, by temperature gradient zone melting.

16 Claims, 13 Drawing Figures

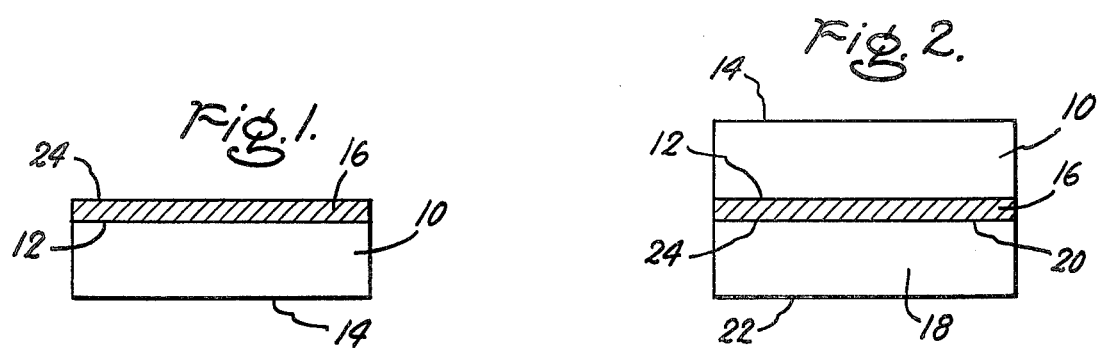
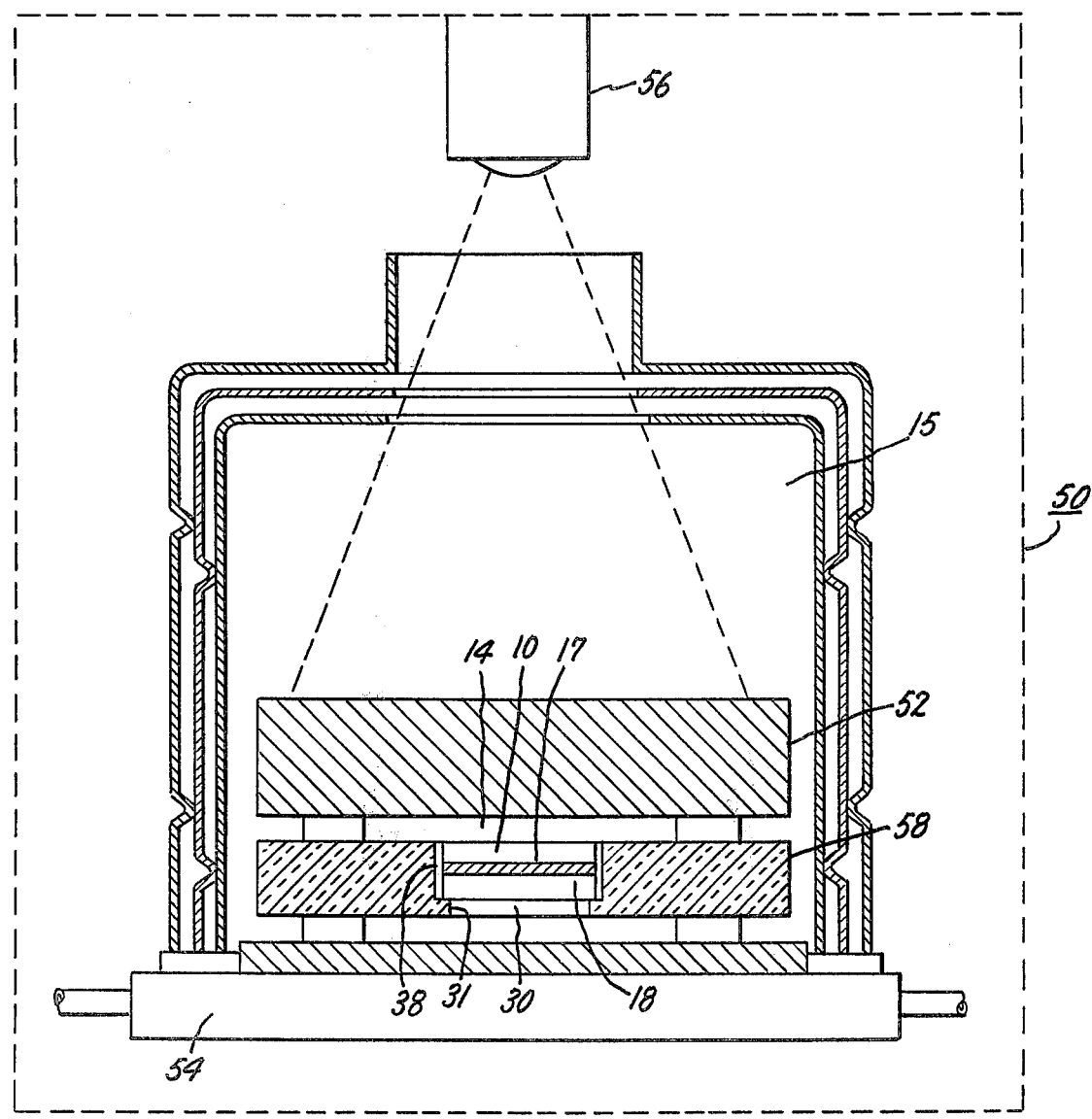

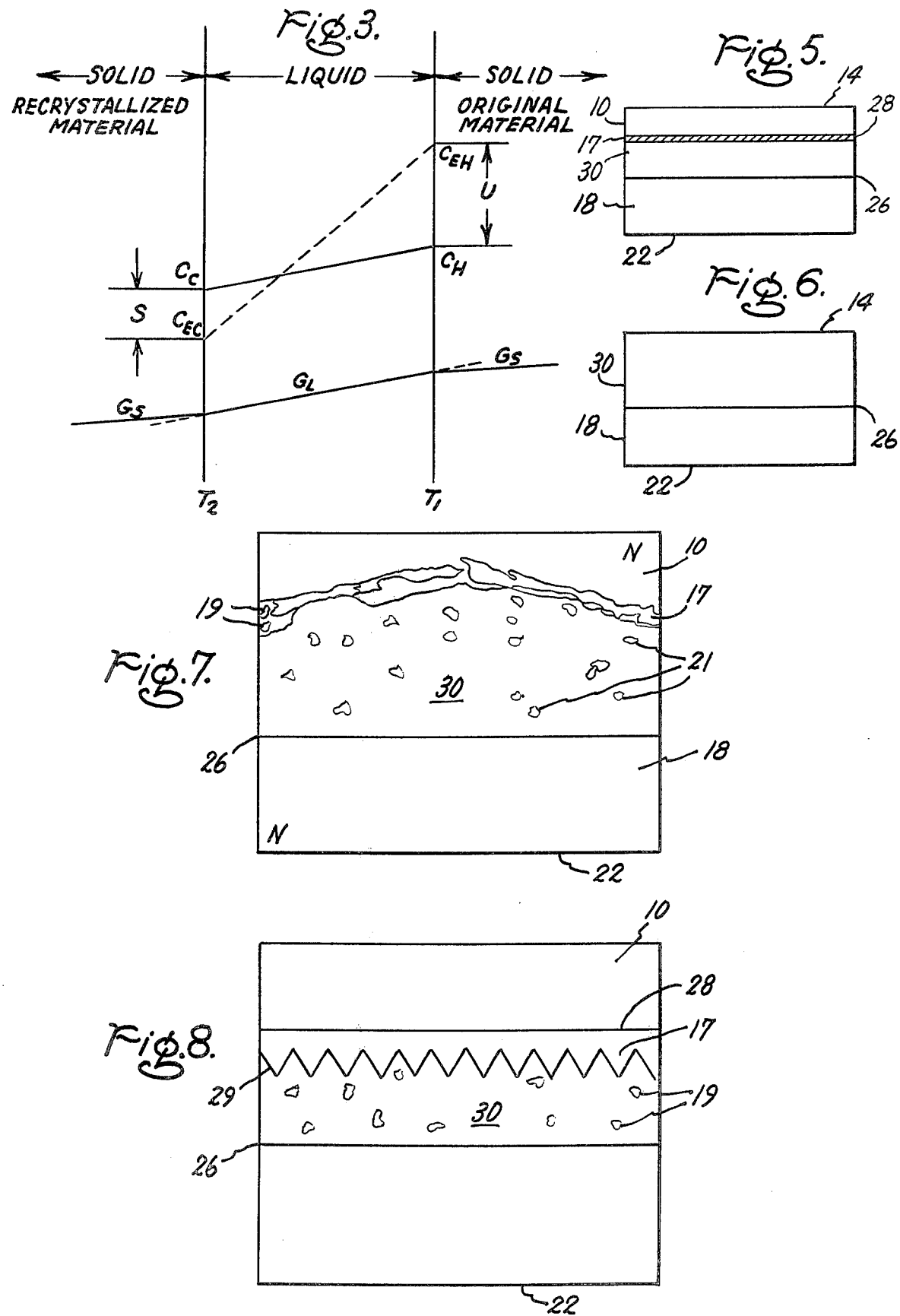

DEEP POWER DIODE

CROSS-REFERENCE TO RELATED PATENT APPLICATION

This invention is a Continuation-In-Part of our patent application Ser. No. 411,011, filed Oct. 30, 1973 now abandoned and assigned to the same assignee as the present invention.

BACKGROUND OF THE INVENTION

1. Field of the Invention

This invention relates to semiconductor power diodes and a temperature gradient zone melting process for making the same.

2. Description of the Prior Art

Heretofore, commercial semiconductor diodes have been made by diffusion, alloying or epitaxial growth techniques. All such processes involve procedures wherein the optimum physical characteristics of the diodes are never achieved. Procedures are such that the introduction of contaminants inherent with the process techniques practiced degrade the physical characteristics of the diodes manufactured.

W. G. Pfann is his U.S. Pat. No. 2,813,048, teaches thermal gradient zone melting techniques for making various semiconductor devices. However, Pfann's devices had too many deficiencies to enable the process to be employed commercially.

An object of this invention is to provide a new and improved semiconductor power diode, the structure of which overcomes the deficiencies of the prior art.

Another object of this invention is to provide a new and improved semiconductor power diode which has maximum theoretical breakdown voltage as determined by the materials embodied therein.

Another object of this invention is to provide a new and improved semiconductor power diode which has a sharper P-N junction profile than any P-N junctions in prior art devices.

A further object of this invention is to provide a new and improved semiconductor power diode which has a faster recovery time and better switching characteristics than the prior art power diode devices.

A still further object of this invention is to provide a temperature gradient zone melting process to make a new and improved semiconductor power diode which is substantially free of defects such, for example, as metallic inclusions.

Other objects of this invention will, in part, be obvious and will, in part, appear hereinafter.

BRIEF DESCRIPTION OF THE INVENTION

In accordance with the teachings of this invention, there is provided a large area semiconductor power diode comprising at least two integral regions of semiconductor material. Each region has a predetermined level of resistivity and two major opposed surfaces which are, respectively, the top and bottom surfaces thereof. Each of the at least two regions is produced from an individual wafer, or body, of semiconductor material. The wafers are oriented in a manner whereby the major surface of one is in an abutting contact relationship with each other. A layer of metal vapor deposited on at least one of the abutting surfaces is migrated through the wafer on which it is deposited by thermal gradient zone melting to physically join the two wafers together and to form a region of recrystallized semiconductor material of that wafer.

DESCRIPTION OF THE DRAWINGS

FIGS. 1 and 2 are elevation views, in cross-section, of bodies of semiconductor material being processed in accordance with the teachings of this invention;

FIG. 3 is a schematic of the relationship of the thickness of a melt of metal-rich semiconductor material migrating through a solid body of semiconductor material by TGZM at an elevated temperature;

FIG. 4 is an elevation view, partly in cross-section, of apparatus suitable for practicing the process of this invention;

FIGS. 5, 6, 7, 8 and 9 are elevation views, in cross-section, of the bodies of semiconductor material of FIGS. 1 and 2 being processed further in accordance with the teachings of this invention;

DESCRIPTION OF THE INVENTION

Figure 9:
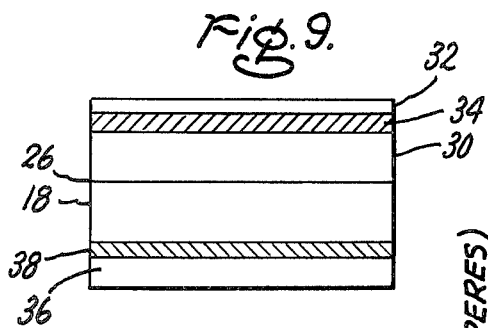

Referring now to FIG. 1, there is shown a first body 10 of single crystal semiconductor material having a first type conductivity and a preferred resistivity. The body 10 has a top surface 12 and a bottom surface 14 which are two major surfaces substantially parallel to each other.

The body 10, as referred to by us, is, by our definition, a wafer of semiconductor material normally employed in the semiconductor industry and available on the commercial market. Such wafers are of the order of 1 inch, 1½ inch, and up to 3 or more inches in diameter. The wafers are at least 4 mils in thickness to enable production workers to handle the wafer properly without incurring excessive losses resulting from breakage of the wafers during process handling. Other wafers of thicknesses of 6, 8, 10 mils and more are also suitable. Alternately, one may also cut his own wafers or bodies 10 from commercially available rod stock or from in-plant grown material. In such instances, the thickness of the wafer or body 10 may exceed 10 mils and be as thick as desired for the final product and which can be reasonably processed.

The resistivity of the material comprising the body 10 varies with the requirement for the desired breakdown voltage of the device to be built. The body 10 has a preferred planar (111) crystallographic structure for the orientation of its surfaces 12 and 14. This preferred (111) planar crystallographic structure of the surfaces is required to enable the liquid metal to maintain a substantially uniform front which advances forward through the body 10 during a temperature gradient zone melting process employed in this invention. It has been discovered that the migration of the liquid melt, that is the metal composition of semiconductor material and the material deposited on the surface, must be in a direction normal to the natural solid-liquid (111) facet plane of the semiconductor metal liquid system. Thus the planar zone is bounded by the (111) facet plane. If the migration proceeds oblique to the (111) facet plane, then the liquid melt zone becomes unstable and breaks up into droplets. Any droplet which become entrapped in the body 10 upon completion of migration results in defects such, for example, as stressed solid metallic inclusions, which affect the physical and operating characteristics of the diode by inducing strain and stresses in body 10. Any objects imbedded in the P-N junction results in current leakage and degradation of the electrical characteristics of the device. Suitable materials for comprising the body 10 are silicon, silicon carbide, gallium arsenide, germanium, compounds of a Group II element and a Group VI element and compounds of a Group III element and a Group V element.

In order to describe the invention more fully, the body 10 will be described as being of silicon semiconductor material having a thickness of about 10 mils and a diameter of approximately 1½ inches.

The body 10 of silicon is prepared in the customary way of all semiconductor materials for metal vapor deposition by such suitable process means as grinding, polishing, lapping, and chemical polishing to remove damaged layers of semiconductor material. The process of preparing the body 10, including the aforementioned process steps, which are not shown, is not described in detail for such processing and treatment of the body 10 is well known in the art and is not pertinent to the invention herein.

A layer of a suitable metal is deposited on the top surfaces 12 of the body, or wafer 10. The material of the metal layer 16 is one that will impart to the material of the body 10 a second and opposite type conductivity, intrinsic conductivity, or the same type conductivity as before but of a different level of resistivity. The material of the metal layer 16 may also include two or more different materials in order to tailor the level of resistivity of the recrystallized semiconductor material to be produced by the thermal gradient zone melting process. The thickness of the layer 16 is such that when the material of the layer 16 melts and forms a melt, or molten zone, of metal-rich semiconductor material, the thickness of the melt, or molten zone, will not exceed the limits established for the stable migration of the molten zone through the solid semiconductor material.

The thickness of the melt of metal-rich semiconductor material to be migrated through the body, or wafer 10, is temperature dependent. We have discovered that there is a critical thickness L which is dependent upon the temperature at which the thermal gradient zone melting process is practiced.

Referring now to FIG. 3, there is illustrated a schematic of the relationship of a melt of metal-rich semiconductor material of thickness L migrating through a solid body of semiconductor material by TGZM at an elevated temperature $T_1$. L is the critical thickness of the melt zone of a metal-rich semiconductor material to be migrated through the body 10 from the colder surface toward the hotter surface. The front face of the melt zone is at temperature $T_1$ and the rear surface of the melt zone is at $T_2$. The thermal gradient across the thickness L of the melt zone is $G_L$. If $K_S$ is the thermal conductivity in the solid material and $K_L$ is the thermal conductivity in the liquid, then $$G_L = \frac{K_S}{K_L} G_S, \qquad (1)$$

where
$G_S$ is the thermal gradient in the solid material.

The dotted line connecting $C_{EC}-C_{EH}$ represents the drop in the equilibrium, or theoretical, concentration of the semiconductor material through the melt, or molten zone, at zero velocity of the migrating liquid zone. However, since the molten zone is moving at a given velocity V, expressed in centimeters per second (cm/sec), the slope of the solid line $C_C-C_H$, which is the actual drop in the concentration of the semiconductor material in the liquid of the molten zone, deviates from the theoretical line $C_{EC} - C_{HC}$. The value of U which is the undersaturation of the semiconductor material in the liquid of the molten zone expressed in atomic percent of the semiconductor material, required at the hot forward interface between the molten zone and the solid original material is increased. At the same time the value of S, the supersaturation of the semiconductor material in the liquid of the molten zone at the colder rear interface, expressed in atomic percent of semiconductor material, is required to drive the deposition, or crystallization, process of semiconductor material from the melt, or molten zone. The semiconductor material is dissolved at the hot forward interface and diffuses through the molten zone toward the colder rear interface where it is deposited as the recrystallized semiconductor material. The recrystallized semiconductor material has a predetermined concentration of the metal of the molten zone, distributed substantially uniformly throughout as determined by the solid solubility limit of that metal in that semiconductor material at the rear interface temperature $T_2$. Since the temperature $T_2$ at the rear interface is slightly less than the temperature $T_1$ at the forward interface, $T_2$ is generally referred to be the same as $T_1$ for simplification. This difference in values between $T_1$ and $T_2$ appears to have no appreciable effect on results obtained since the difference is less than the order of a degree.

The change in concentration of dissolved semiconductor material in the metal-rich semiconductor liquid material with temperature can be expressed by the mathematical relationship $$\frac{dC}{dT} \qquad (2)$$

If $G_L$ is the thermal gradient in the liquid (molten zone) and $$\frac{dc}{dT}$$

is the change in concentration of dissolved semiconductor material in the metal-rich liquid with temperature, then in order for the molten zone of L thickness to be stable during migration, the zone thickness L, we have discovered, may be expressed as follows:

$$L = < \frac{(U+S)}{\left(\frac{dc}{dT} G_L\right)} \qquad (3)$$

When L has a value which is greater than that determined by equation (3), we have found that the liquid, or molten zone, becomes unstable during migration and begins to break up into a plurality of liquids regions.

The value L may also be expressed in terms of a constant A, which is for a specific metal-semiconductor material system, and the migration velocity, V, of the molten zone expressed in centimeters per degrees centigrade. Expressed in these terms, equation (3) becomes $$L = < \frac{AV}{\left(\frac{dc}{dT} G_L\right)} \quad (4)$$

We have at this time worked primarily with the aluminum-silicon system. From our work we have prepared the following Table which tabulates the data we obtained by practicing the migration of aluminum, and predominently aluminum metal systems, through silicon semiconductor material at various temperatures of migration by a thermal gradient zone melting process.

TABLE

| Temp (° C) | $\frac{V}{G_L}$ (cm²/° c-sec) | $\frac{dc}{dT}$ (atomic %/° C) | L (microns) |
|---|---|---|---|
| 600 | 7 × 10⁻⁸ | 6.6 × 10⁻⁴ | 212 |
| 700 | 8 × 15⁻⁸ | 7.5 × 10⁻⁴ | 213 |
| 800 | 10⁻⁷ | 7.9 × 10⁻⁴ | 253 |
| 900 | 1.2 × 10⁻⁷ | 8.4 × 10⁻⁴ | 286 |
| 1000 | 1.7 × 10⁻⁷ | 8.8 × 10⁻⁴ | 386 |
| 1100 | 2.2 × 10⁻⁷ | 10 × 10⁻⁴ | 440 |
| 1200 | 5 × 10⁻⁷ | 12.1 × 10⁻⁴ | 826 |
| 1300 | 10⁻⁶ | 14.3 × 10⁻⁴ | 1400 |
| 1400 | 3 × 10⁻⁶ | 16.6 × 10⁻⁴ | 3600 |

The above tabulated data is suitable for determining L even when up to 10 percent of the metal migrated consists of one or more other dopant, or intrinsic, materials, relative to silicon, in the aluminum metal.

For the aluminum-silicon system, we have found that (U + S) is equal to 200 atomic percent of silicon per centimeter per second times the velocity of the molten zone of aluminum-rich silicon through a solid body of silicon. Substituting for (U + S) in equation (4) for an aluminum-silicon system we have the following:

$$L_{Al-Si} = < \frac{200 \text{ atomic } \%/cm/sec \cdot V}{\left(\frac{dc}{dT} \cdot G_L\right)} \quad (5)$$

As an example of the use of the data of Table I we can find the value for $L_{Al-Si}$ at 1100° C for the migration temperature and a temperature gradient, $G_L$, of 50° per centimeter as follows:

$$L_{Al-Si} = < \frac{200 \text{ atomic } \% \frac{sec}{cm}}{\frac{10 \times 10^{-4} \text{ atomic }\%}{°C}} \cdot 2.2 \times 10^{-7} \frac{cm^2}{°C\text{-sec}}$$

$$L_{Al-Si} = < 440 \text{ microns}$$

For stable migration of the molten zone, its width, or thickness L, should be less than 440 microns.

However, we have found that the smaller the value of L is retained, the less one has to worry about maintaining the thermal gradient aligned substantially with the preferred crystal axis of < 111 > for the material of the wafer. A slight deviation of up to 3° or 4° from the < 111 > axis is permissable. Further, less metal material is required for migration through the wafer. As described later, we prefer a value of 10 to 20 microns for L.

However, one must have good wetting of the surface by the metal to be migrated in order to initiate a stable molten zone. Foils and sheets apparently do not provide the intimate contact required between the two materials.

In order to describe the invention more fully, the semiconductor material is said to be of N-type conductivity silicon and the metal of the layer 16 to be of aluminum to produce the second, and opposite type conductivity, P-type conductivity, in the body 10. The layer 16 of aluminum is deposited by any suitable means known to those skilled in the art such, for example, hot filament vacuum deposition, electron-beam deposition and the like, which will produce a substantially oxygen-free deposit of metal for the temperature gradient zone melting process to be practiced. The metal layer must be uniformly defect free and clean to avoid wetting problems and inclusions which result in unstable migration. A deposited thin film is superior to metal foil material because with a deposited film a clean, adherent, intimate and uniform contact to the semiconductor body is formed that is free of foreign inclusions, bubbles and areas of noncontact.

The layer 16 of metal must be thick enough to cover the entire surface 12 with metal. Normally, a thickness of no less than 1 micron has been discovered to be adequate to assure complete coverage of the surface 12. However, the layer 16 should not be greater than approximately L in thickness. It has been discovered that when the layer 16 exceeds L in thickness, the melt zone which is migrated through the body 10 also exceeds L in thickness. When the thickness of the melt zone exceeds L, the melt zone may encounter intrinsic instability created by thermal and mass transport conditions other than those previously described and the zone becomes unstable at the solidifying solid-liquid interface.

With reference to FIG. 2, a second body, or wafer, 18 of silicon single crystal semiconductor material of N-type conductivity and a selected resistivity is prepared in the same manner as the first body 10. The body, or wafer, 18 is defined in the same manner as previously defined for the body, or wafer. The second body 18 has a top surface 20 and a bottom surface 22 which are two major surfaces substantially parallel to each other. The second body 18 of silicon may have any of the crystallographic structures which are inherent of silicon material. Preferably, however, to avoid confusion in making a large area power diode, the second body 18 of silicon also has a 111 planar crystallographic structure for the surface 20 and 22. It is to be noted that body 18 is preferably of the same material as the body 10.

A sandwich of the two processed silicon bodies 10 and 18 is prepared. The first body 10 is disposed on the second body 18 and so oriented that the exposed major surface 24 of the layer 16 of aluminum is disposed on, and in physical contact with the top surface 20 of the second body 18 of silicon.

The prepared sandwich is placed in an apparatus suitable for producing a thermal gradient substantially coinciding with the vertical axis of the bodies 10 and 18 between the two surfaces 14 and 22. The thermal gradient is therefore substantially aligned with the < 111 > axis of the body 10. The bottom surface 14 of the first body 10 of silicon is oriented so as to be exposed to a source of thermal energy wherein the temperature is higher than that to which the bottom surface 22 of the body 18 of silicon is exposed. A temperature gradient zone melting (TGZM) process is practiced to produce a large area power diode. A temperature gradient of from 10° C per centimeter to 200° C per centimeter is maintained in the bulk of silicon material during the migration of the layer 16 of aluminum through the body 10. Preferably, the temperature gradient is maintained at a calculated temperature gradient of 100° C/cm in the bulk of silicon comprising the sandwich. The calculated temperature gradient ▼ $T_s$ is derived from the equation:

$$K_s \nabla T_s = E \sigma T_c^4$$

where
- $K_s$ is the thermal conductivity of the semiconductor material-silicon
- E is the emissivity of the semiconductor material-silicon.
- $\sigma$ is the Stefan-Boltzman Radiation constant.
- $T_c$ is the temperature of the cold face of the body of semiconductor material-silicon.
- $\nabla T_s$ is the temperature gradient in the body of semiconductor material.

The temperature gradient zone melting (TGZM) process may be carried out at a pressure ranging from approximately $1 \times 10^{-7}$ torr to approximately $1 \times 10^{-5}$ torr. Alternately, the process may also be practiced at atmospheric pressure embodying a suitable source of radiant energy.

A schematic of a suitable vacuum furnace apparatus 50 for the temperature gradient zone melting process of this invention is shown in FIG. 4. The processed sandwich of FIG. 2 is disposed between a hot source 52 and a cold source 54. The hot source may, for example, be a block of molybdenum suitably heated by a source 56 of thermal energy such, for example, as an electron beam. It is essential that the hot source 52 uniformly heat the bottom surface 14 of the body 10 to a temperature of from 700° C to 1400° C to achieve the range of calculated temperature gradient of from 50° C per centimeter to 200° C per centimeter. The cold source 54 may, for example, be a water-cooled copper block. When the cold source 54 is a water-cooled block maintained at from 25° C to 50° C and the top surface 14 of the body 10 is uniformly heated to 1000° C ± 20° C the calculated temperature gradient is 100° C per centimeter for the bulk of silicon material through which the aluminum layer 14 is to be migrated. Radiation shields 58 are provided about the processed sandwich and the hot and cold sources 52 and 54 respectively to prevent excessive loss of heat or possible influence on the thermal gradient in the bodies 10 and 18 during the TGZM process. In particular, the radiation shields prevent thermal energy from being transported to or from the sides of the sandwich.

Referring now to FIGS. 5 and 6, initially, upon being heated to the operating temperature for the temperature gradient zone melting process, the layer 16 (FIG. 2) of aluminum becomes molten and alloys with the immediately adjacent silicon material of the top surfaces 12 and 20 of the respective bodies 10 and 18 to produce a continuous molten interface of aluminum-rich silicon. The molten interface continues to increase in size until a pool of aluminum-rich silicon liquid 17, preferably no greater than about 20 microns in thickness, is formed between the two bodies 10 and 18. As a result of the temperature gradient, the pool of aluminum-rich silicon liquid 17 begins to migrate up through the body 10 from the top surface 12 thereof towards the bottom surface 14. Aluminum-doped recrystallized silicon 30 of the body 10 and that of the top surface 20 of the body 18 is deposited beginning at the interface of the layer 16 and the body 18 thereby creating a P-N junction 26. The migration of the aluminum-rich silicon liquid upward through the body 10 is accomplished by establishing and maintaining the aforementioned finite thermal gradient in a first direction substantially parallel to the vertical axis of the sandwich. Coextensively in time, a second or zero temperature gradient is established and maintained in the sandwich in a second direction which is normal to the first direction through the assistance of the radiation shields 58 of the apparatus 50. The interface 28 between the aluminum-rich silicon liquid 17 and the silicon of the body 10 is a large liquid area in the silicon body 10 having a 111 planar crystallographic structure and a < 111 > migration direction and migrates as a substantially continuous planar surface. Examination of the front as it migrates up through the body reveals it to be continuous throughout its expanse. As long as the thermal gradient is maintained, the molten pool of aluminum-rich silicon 17 continues to migrate upward through the body 10 continually creating a new molten zone of aluminum and silicon at its front interface 28 and depositing an aluminum doped recrystallized silicon region 30 of ever increasing size. The recrystallized region 30 has a solid solubility of the dopant impurity therein which imparts the conductivity type and selected level of resistivity to the region 30. Because the temperature gradient across the thickness of the body 10 is small, and the slope of the solid solubility curve for aluminum in silicon is small in the temperature range in which the temperature gradient zone melting is practiced, the dopant concentration and the resistivity throughout the recrystallized region 30 is substantially constant. That is, the impurity concentration of aluminum in the silicon of the region 30 is approximately $\times 10^{19}$ atoms per cubic centimeter. An added benefit of this process is that the migration of the melt through the body provides a zone refining process for the material of the body. As a result, the material is cleansed of impurities and some defects during the process.

In silicon having crystallographic structure orientation other than < 111 >, the molten interface 28 of the migrating aluminum-silicon melt is very irregular. If the deviation from the < 111 > growth axis be too great, the migrating interface 28 breaks up and results in a highly irregular P-N junction in the body 10 and a large area power diode of undesirable electrical characteristics. However, when the migration is maintained substantially along the < 111 > axis, the temperature gradient zone melting process continues with a substantially uniform molten interface 28 until all of the body 10 is converted to an aluminum-doped region 30 of recrystallized silicon material of the body 10. The excess aluminum is removed from the surface 14 upon completion of the process. The completed large area power diode structure is illustrated in FIG. 6.

Referring now to FIG. 7, there is shown the breaking up of the melt zone 17 which occurs when migration is not practiced substantially along the < 111 > axis of the body 10. As stated heretofore, the migration of the zone 17 must proceed normal to the natural solid facet plane of the semiconductor metal liquid system. The planar melt zone 17 is therefore bonded by the face plane. When migration proceeds oblique to the facet plane, the zone 17 breaks up into various sizes of droplets 19. The larger of the droplets 19 migrate faster than the next largest size droplets. Experience has shown that usually all of the larger droplets, ranging from 100 microns in diameter upward, are migrated out of the body 10 during the process. The next largest group of droplets ranging in size from 100 to 10 microns in diameter do not migrate as fast and some of the droplets 21 remain behind as metal inclusions upon completion of migration of the zone 17. However, droplets no larger than about 10 microns in diameter do not migrate, or migrate so slowly as to have almost no movement, and consequently remain behind in the region 30 as metal inclusions. These metal inclusions are defects which affect the operating characteristics of the completed diode.

With reference to FIG. 8, there is shown a condition which occurs when the planar melt zone 17 is greater the critical stability thickness L. The front face 28 of the planar zone 17 remains intact. However, because of thermal gradient and mass transport of melt through the body 10, the zone 17 encounters intrinsic instability and the rear face 29 becomes serrated. Eventually, the rear face 29 disintegrates and forms droplets 19 which acts as previously described in relation to the FIG. 7. These droplets which become entrapped in the region 30 become metal inclusions upon solidification and are defects which affect the operating characteristics of the completed device.

For a more detailed description of the process and the apparatus employed in the migration of selected dopant materials through a body of semiconductor material, including for example, the migration of aluminum in silicon, one is directed to our following copending patent applications filed on the same day at this patent application and assigned to the same assignee as our present application: Method of Making Deep Diode Devices, Ser. No. 411,150, now U.S. Pat. No. 3,901,736; High Velocity Thermal Migration Method of Making Deep Diodes, Ser. No. 411,021, now U.S. Pat. No. 3,901,801; Deep Diode Devices and Method and Apparatus, Ser. No. 411,001, now abandoned in favor of Ser. No. 552,154; High Velocity Thermomigration Method of Making Deep Diodes, Ser. No. 411,015, now U.S. Pat. No. 3,898,106; Deep Diode Device and Method, Ser. No. 411,009, now U.S. Pat. No. 3,902,925; and Stabilized Droplet Method of Making Deep Diodes Having Uniform Electrical Properties, Ser. No. 411,008, now U.S. Pat. No. 3,899,361.

Referring now to FIG. 9, a first electrical contact 32 is affixed to the region 30 by a suitable ohmic solder layer 34. The large area power diode is completed by affixing a second electrical contact 36 to the body 18 by a suitable layer 38 of ohmic solder material.

Large area power diodes prepared in the manner heretofore described achieve excellent electrical characteristics without the necessity of providing passivating coatings on exposed surfaces of the devices, including the exposed surfaces of the P-N junction. The resulting P-N junctions upon completion of processing are clean and very definitive. An abrupt, step P-N junction is present. The breakdown voltage of diodes made in accordance with the teachings of this invention achieves substantially the theoretical breakdown voltage which is obtainable for the semiconductor material of the bodies 10 and 18 employed and the dopant material comprising the layer 16. The leakage current of the prepared diode devices is excellent when compared to prior art devices.

The following examples are illustrative of the teachings of this invention.

EXAMPLE I

Two wafers of silicon single crystal series conductor material, each being one centimeter in thickness, were cut from a rod one inch in diameter. The silicon material of the rod was of N-type conductivity being phosphorous doped and being of 10 ohm-centimeter resistivity, 50 microsecond lifetime, < 111 > crystallographic orientation with $1 \times 10^3$ dislocations per square centimeter. Each wafer was prepared in the usual manner of polishing and lapping for semiconductor process work. A layer of aluminum metal 10 microns in thickness was deposited on one major surface of 111 planar orientation of one wafer by electron beam vapor deposition. The purity of the aluminum metal was 99.9999%. Deposition of the aluminum was practiced at a pressure of $1 \times 10^{-5}$ torr and required 50 minutes to deposit the layer of aluminum. No special preparation was practiced to protect the sides and other major surface of the wafer since they were shielded by the type of apparatus employed.

The two wafers were then disposed relative to each other as shown in FIG. 2 to form the workpiece "sandwich". The sandwich was disposed in apparatus suitable for practicing thermal gradient zone melting. The heat source was a molybdenum disk heated by an electron beam apparatus. The cold source, or heat sink, was a water-cooled copper disk. A calculated temperature gradient of 100° C per centimeter was established in the silicon material of the semiconductor sandwich substantially aligned with the <111> axis of the wafers by heating the molybdenum disk to a temperature sufficient to heat the major surface of the wafer closest to the molybdenum disk to 1090° C ± 20° C and maintaining it thereat. The temperature of the water cooled copper disk was maintained at 25° C ± 5° C. The process was practiced at a pressure of $1 \times 10^{-5}$ torr for 2 hours. The aluminum layer was not migrated entirely through the body of silicon.

Upon completion of the process, the sandwich was removed, sectioned, and examined in infrared transmission. The two wafers had been physically joined together. The P-N junction produced by the thermal gradient zone melting process had an extremely sharp junction profile. The aluminum-silicon migration had progressed a distance of 3 millimeters into the wafer from the surface upon which the aluminum had been deposited.

A sample diode 6.8 millimeters × 15 millimeters was cut from the processed sandwich and subjected to electrical testing. The P-N junction area was calculated to be 5 square millimeters. The breakdown voltage of the sample diode was 400 volts. This is the theoretical voltage which can be achieved for 10 ohm-centimeter N-type silicon doped with aluminum wherein the impurity concentration therein is approximately $2 \times 10^{19}$ atoms per cubic centimeter and the recrystallized semiconductor material has a resistivity of about $8 \times 10^{-3}$ ohm-centimeters. The current leakage at 10 volts was $3 \times 10^{-8}$ amperes. At 100 volts, the current leakage was $1 \times 10^{-7}$ amperes. The width of the P-N junction was determined by capacitance versus voltage measurements. The P-N junction profile of the P-N junction formed by the initial aluminum layer and the uncoated silicon wafer was one-third of a micron in width. Very little diffusion of aluminum into silicon across the P-N junction had occurred during the process. The lifetime of the processed body "sandwich" material was one microsecond. This process was carried on under nonclean room conditions.

A graph of the reverse current in amperes versus the reverse bias in volts of a sample having a 3 square millimeter P-N junction area of the above sample is shown in FIG. 9.

The diode as prepared has excellent electrical characteristics for both the breakdown voltage and the current leakage requirements. As noted, these achievements were obtained without any special surface passivation means being employed for the processed example and without employing clean room conditions.

EXAMPLE II

The process of Example I was repeated except that the material of each of the wafers had a < 100 > crystallographic orientation. The established thermal gradient was substantially aligned with the < 100 > axis of the wafers.

Examination of the P-N junction formed by the migrating interface showed the interface to be highly irregular in shape. Such a device is unreliable for a large area high power diode device. However, low power diodes can be manufactured from the processed "sandwich" by trimming back the sandwich to remove the irregular interface.

Large area power diodes prepared by the process of this invention exhibit extremely sharp junction profiles. That is, a step P-N junction is obtained. Very little diffusion of the aluminum into the silicon from across the P-N junction occurs in the process of this invention. The width of the P-N junction is approximately one-third micron for a process temperature range of from 700° C to approximately 1000° C. The lifetime of large area power diodes of this invention when prepared under clean room conditions are superior to the lifetime of prior art devices.

Figure 10:
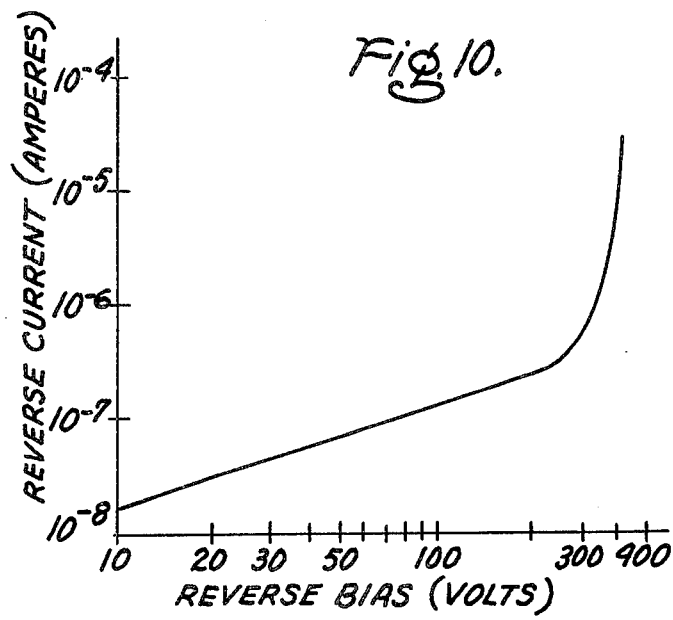
FIG. 10 is a graph of reverse current in amperes vs reverse bias in volts of a semiconductor power diode made in accordance with the teachings of this invention.

An alternate method of making a high power diode embodies primarily vapor deposition techniques for both the semiconductor material and its dopant material. Referring now to FIG. 10, a body, or wafer, 110 of semiconductor material is prepared by suitable means such, for example, as by lapping and polishing for vapor deposition of metal thereon. The body 110 has a top surface 112 and a bottom surface 114. The dimensions of the body 110 is as previously described for the bodies, or wafers, 10 and 18. The material of the body 110 may be silicon, germanium, silicon carbide, gallium arsenide, a compound of a Group II element and a Group VI element and a compound of a Group III element and a Group V element. In order to describe the invention more specifically, the body 110 will be described as being of silicon semiconductor material having N-type conductivity.

A layer 116 of metal of from about one micron to about 20 microns in thickness is deposited on the surface 112 by such suitable means, as by vapor deposition, electron beam, and the like, wherein the layer of metal deposited will be substantially oxygen and defect free. The material of the layer 116 is one that will easily wet the surfaces of the semiconductor material that it comes in contact with during the initial period of heating of the thermal gradient zone melting process. In addition, the material of the layer 116 comprises at least one metal suitable for doping semiconductor material for producing a desired P-type, N-type conductivity or intrinsic conductivity. A suitable material for comprising the layer 116 is aluminum when the body 110 is silicon of N-type conductivity.

A layer 118 of semiconductor material is deposited on the layer 116 of metal. The semiconductor material may be the same as that of, or be any of the other materials suitable for comprising, the body 110. The material of the layer 118 may be deposited by any suitable means such, for example, as by vapor phase deposition or by depositing the material in powder form on the surface of the layer 116. The layer 118 should preferably be of the same thickness as that thickness of the layer 116 of metal to prevent the molten metal layer from penetrating the layer 118 in one or more locations prior to the remainder of the molten layer. This prevents the possibility of having faulty devices resulting from the process. Since the thickness of the layer 118 is most usually small, in the order of up to 10 or 20 microns, orientation of the crystallographic structure of the layer 118 is not critical. In this example, the layer 118 is said to be of polycrystalline silicon.

Figure 11:
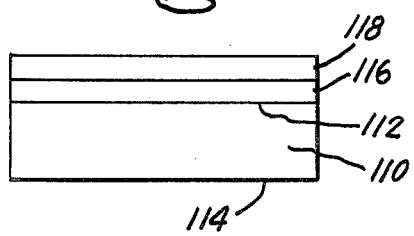
FIGS. 11, 12 and 13 are elevation views of a body of semiconductor material being processed by an alternate method in accordance with the teachings of this invention.

With reference to FIG. 11, the body 110, as processed, is placed in a suitable thermal gradient zone melting process apparatus as previously described, the layer 116 of aluminum becomes molten and forms a melt of aluminum-rich silicon with silicon of the surface 112 of the body 110 and the immediately adjacent silicon of the layer 118. As the thermal gradient zone melting process proceeds, a region 120 of recrystallized silicon of the layer 118 containing solid solubility of aluminum therein is produced having the same crystal structure orientation as that of the body 110. The impurity concentration of the region 120 is approximately $2 \times 10^{19}$. A P-N junction 122 is formed by the contiguous surfaces of the region 120 and the body 110 of P-type and N-type conductivity respectively. The excess molten aluminum which has migrated through the layer 118 appears on the surface 126 of the completed device 124 and is solidified thereon. The excess layer of aluminum is removed by suitable means such, for example, as by selective etching and grinding.

Although the teachings of this invention has been directed toward the making of large area power diodes, other applications of the invention are feasible. For example, referring again to FIG. 5, the recrystallized region 30 may be $P^+$-type conductivity aluminum-doped silicon formed by the thermal gradient zone melting process on a body 18 of P-type silicon. In a like manner a recrystallized region 30 of $N^+$-type conductivity is formed on a body 18 of N-type conductivity.

Figure 12:
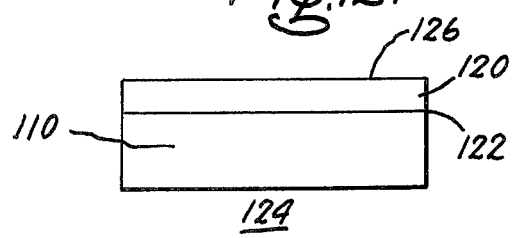
Figure 13:
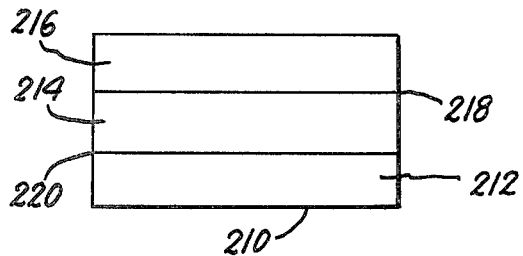

Referring now to FIG. 12, a semiconductor device 210 comprises three regions 212, 214 and 216 of semiconductor materials having different resistivities and the same or different type conductivity. For example, the region 212 may comprise N-type conductivity silicon, the region 214 $N^+$-type conductivity silicon and the region 216 $P^+$-type conductivity silicon. The interface 218 between the regions 214 and 216 is a P-N junction formed by the contiguous surfaces of the regions 214 and 216 of opposite type conductivity. The regions 214 and 216 are each formed from recrystallized bodies of semiconductor material of < 111 > crystallographic orientation like the body 10, and processed in the same or similar manner as the body 10, to form the respective regions. Similarly, the device 210 may be of the configurations N-P$^+$-N$^+$, P-P$^+$-N$^+$ and P-N$^+$-P$^+$.

Similarly, the device 210 may be of a configuration wherein the region 214 is of N-type conductivity and each of the regions 216 and 212 are recrystallized bodies of semiconductor materials of P$^+$-type conductivity and initially of < 111 > crystallographic structure. P-N junctions are formed by the interfaces 218 and 220 of the respective pairs of the regions 214 and 216 and 214 and 212 of opposite type conductivity. The regions 212 and 216 are formed by the thermal gradient zone melting process of this invention and the regions 212 and 216 are derived from bodies of semiconductor material prepared in the same manner as the body 10 as heretofore described. Other configurations of the device 210 prepared in this manner are as varied as the possibilities of the conductivities of the regions 212, 214 and 216. Since each of the regions 212, 214 and 216 may each be of N-type, N$^+$-type, P-type and P$^+$-type conductivity, the device 210 can be of any of configurations that is possible by varying the conductivities of the regions 212, 214 and 216 in accordance with design requirements. These various configurations offer excellent opportunities for further processing of the device 210 into multi-region semiconductor devices such, for example, as power transistors, semiconductor controlled rectifiers, bidirectional switches, and the like. The choice of semiconductor material for the regions 212, 214 and 216 in accordance with design requirements and the process requirements of this invention.

Alternately, the device 210 may be fabricated by starting with a body of suitable semiconductor material for the region 214. The regions 212 and 216 may be obtained from vapor deposited layers of semiconductor material. Additionally, the region 216 or 212 may be obtained from vapor deposited semiconductor material. The other region 212 or 216 is obtained from a body of semiconductor material initially of < 111 > crystallographic structure.

The invention has been described relative to practicing thermal gradient zone melting in a negative atmosphere. However, it has been discovered that when each body of semiconductor material is a thin wafer of the order of 10 mils in thickness, the thermal gradient zone melting process may be practiced in an inert gas atmosphere of hydrogen, helium, argon and the like in a furnace having a positive atmosphere. The thickness of the wafers, or bodies, may also exceed 10 mils provided the crystallographic orientation of the material is maintained for the material through which migration is practiced.

Alternatively, thin wafers and thick bodies of semiconductor material may be processed in a positive atmosphere in apparatus embodying a source of radiant energy means.

We claim as our invention:
1. A semiconductor device comprising
at least two integral regions of semiconductor material;
each region having a predetermined level of resistivity, a predetermined type conductivity, and two opposed major surfaces which are, respectively, the top and bottom surfaces thereof;
each of the at least two regions being produced from individual wafers, or bodies, of semiconductor material oriented in an abutting surface to surface relationship and joined to each other by a layer of recrystallized semiconductor material of portions of the mutually adjacent surfaces of the wafers formed in situ by thermal gradient zone melting;
the semiconductor material of at least one of the regions being recrystallized semiconductor material of its respective wafer formed in situ by the migration of a melt of metal-rich semiconductor material along a thermal gradient aligned parallel with a first preferred crystal axis of the material of the respective wafer by the same thermal gradient zone melting process practiced at a predetermined elevated temperature which joined the two regions together, and
the predetermined level of resistivity and the predetermined type conductivity of the recrystallized semiconductor material being determined by the solid solubility limit of that metal of the melt migrated through the wafer in that semiconductor material at that predetermined elevated temperature to impart the level of resistivity and type conductivity thereto.

2. The semiconductor device of claim 1 wherein the semiconductor material of the regions is one selected from the group consisting of silicon, silicon carbide, germanium and gallium arsenide.

3. The semiconductor device of claim 1 wherein the material of each of the at least two regions has a different and opposite type conductivity than the other,
one major surface of one region comprising a top surface of the diode,
one major surface of the other region comprising a bottom surface of the diode, and
a P-N junction formed at the contiguous surfaces of the material of the two regions of opposite type conductivity.

4. The semiconductor device of claim 3 wherein the semiconductor material of each region is one selected from the group consisting of silicon, silicon carbide, germanium and gallium arsenide.

5. The semiconductor device of claim 4 wherein the semiconductor material of each region is silicon,
the conductivity type of the recrystallized semiconductor material is P-type, and
the metal in recrystallized material is aluminum.

6. The semiconductor device of claim 5 wherein the level of resistivity of the recrystallized material of the one region is approximately $8 \times 10^{-3}$ ohm-centimeter,
the level of resistivity of the other region is 10 ohm-centimeter, and
the P-N junction is a step junction.

7. The semiconductor device of claim 5 wherein the original semiconductor material of the wafer through which migration is practiced has a planar crystal orientation of (111) for at least one of its major surfaces and the first preferred crystal axis is < 111 >.

8. The semiconductor device of claim 6 wherein the original semiconductor material of the wafer through which migration is practiced has a planar crystal orientation of (111) for at least one of its major surfaces and the first preferred crystal axis is < 111 >.

9. The semiconductor device of claim 1 wherein the original semiconductor material of the wafer through which migration is practiced has a planar crystal orientation of (111) for at least one of its major surfaces and the first preferred crystal axis is < 111 >.

10. The semiconductor device of claim 1 wherein the device comprises at least three integral regions, the first and third regions each being joined in situ with the respective major surface of the second region, and the semiconductor material of each of the first and second regions being formed in situ and comprising recrystallized semiconductor material of its respective starting wafer.

11. The semiconductor device of claim 10 wherein the semiconductor material of the first and second regions each have the same type conductivity but a different level of resistivity, the semiconductor material of the third region has a second and opposite type conductivity, and a P-N junction formed at the contiguous surfaces of the material of the second and third regions or opposite type conductivity.

12. The semiconductor device of claim 10 wherein the semiconductor material of each of the first and third regions has the same type conductivity, the semiconductor material of the second region has a second and opposite type conductivity, a first P-N junction formed at the contiguous surfaces of the material of the second and third regions of opposite type conductivity, and a second P-N junction formed at the contiguous surfaces of the material of the second and first regions of opposite type conductivity.

13. The semiconductor device of claim 11 wherein the semiconductor material of each of the regions is one selected from the group consisting of silicon, silicon carbide, germanium and gallium arsenide.

14. The semiconductor device of claim 13 wherein the semiconductor material is silicon, the conductivity type of the first and second regions is N-type, the conductivity type of the third region is P-type, and the metal of the melt is aluminum.

15. The semiconductor device of claim 12 wherein the semiconductor material of each of the regions is one selected from the group consisting of silicon, silicon carbide, germanium and gallium arsenide.

16. The semiconductor device of claim 15 wherein the semiconductor material is silicon, the conductivity type of the second region is N-type, the conductivity type of the first and third regions is P-type, and the metal of the melt is aluminum.

* * * * *